United States Patent [19]
Adams et al.

[11] Patent Number: 6,013,159
[45] Date of Patent: Jan. 11, 2000

[54] PARTICLE TRAP IN A MAGNETRON SPUTTERING CHAMBER

[75] Inventors: Bret W. Adams, Sunnyvale, Calif.; Ivo Raaijmakers, Phoenix, Ariz.

[73] Assignee: Applied Materials, Inc., Santa Clara, Calif.

[21] Appl. No.: 08/971,246

[22] Filed: Nov. 16, 1997

[51] Int. Cl.⁷ ............................ C23C 14/00; C23C 14/34
[52] U.S. Cl. ................ 204/192.12; 204/298.16; 204/298.2; 204/298.19; 204/298.06; 204/298.07; 204/298.14; 204/298.22; 204/298.11
[58] Field of Search .................. 204/298.16, 298.2, 204/298.19, 298.06, 298.07, 298.14, 298.22, 298.11, 192.12

[56] References Cited

U.S. PATENT DOCUMENTS

| | | | |
|---|---|---|---|
| 4,874,494 | 10/1989 | Ohmi | 204/192.12 |
| 5,049,251 | 9/1991 | Inoue | 204/192.12 |
| 5,221,425 | 6/1993 | Blanchard | 156/643 |
| 5,316,645 | 5/1994 | Yamagami | 204/298.06 |
| 5,328,585 | 7/1994 | Stevenson | 204/298.2 |
| 5,367,139 | 11/1994 | Bennett | 219/121.59 |
| 5,427,665 | 6/1995 | Hartig | 204/192.12 |
| 5,487,822 | 1/1996 | Demaray | 204/298.09 |
| 5,518,593 | 5/1996 | Hosokawa | 204/192.12 |

OTHER PUBLICATIONS

Praburam, Observation of particle layers levitated in a radio–frequency sputtering plasma, Journal of Vacuum Science & Technology A, vol. 12, 1994, pp. 3137–3145.

*Primary Examiner*—Yogendra Gupta
*Assistant Examiner*—Brian P. Mruk
*Attorney, Agent, or Firm*—Charles S. Guenzer

[57] ABSTRACT

A plasma sputtering reactor in which a magnet is linearly scanned over the back of the sputtering target to enhance the sputtering. The magnet's linear scan is extended to beyond the wafer processing area. When the magnet reaches that point, conditions are changed within the reactor to cause particles otherwise trapped by the magnet to fall into an area of the reactor where they do not fall on the substrate being processed. The changed conditions may include extinguishing the plasma, reducing or reversing the target voltage, positively charging walls of the trap area, or pulsing gas through the plasma. Also, according to the invention, the plasma is ignited with the magnet positioned over the trap area so that particles generated in the ignition process are not immediately deposited on the wafer or the walls of the processing area, and they tend to stay in the trap area.

17 Claims, 1 Drawing Sheet

PARTICLE TRAP IN A MAGNETRON SPUTTERING CHAMBER

FIELD OF THE INVENTION

The invention relates generally to sputtering, also known as physical vapor deposition. The invention related particularly to a magnetron sputter reactor in which the magnet scanning assembly and its operation are modified to remove particles from the chamber.

BACKGROUND ART

Semiconductor integrated circuit chips are composed typically of three different classes of materials, semiconductors (typically silicon), insulators and metals. The most common method of depositing the metal layer is by sputtering, which is also called physical vapor deposition (PVD).

Most commercial sputtering is performed in DC magnetron plasma reactors, such as the Endura 5500 PVD Reactor, available from Applied Materials, Inc. of Santa Clara, Calif., although RF magnetron sputtering is also known. Ohm discloses many of the features of a conventional PVD reactor in U.S. Pat. No. 4,874,494. A wafer or other substrate is supported on a pedestal electrode in close opposition to a target electrode composed of at least part of the material to be sputter deposited. The reactor chamber is filled with argon and a negative DC bias is applied to the target electrode with respect to the pedestal electrode. The bias is sufficiently high to cause the argon to be excited to a plasma state. The resultant positively charged argon ions are attracted to the target and strike it with sufficient energy to dislodge atomic sized clusters of target atoms from the target. That is the target is sputtered. The sputtered particles travel ballistically across the chamber, and some of them strike and stick to the substrate, to thereby sputter deposit the target material on the substrate.

In the case of aluminum or titanium sputtering, the target electrode is composed of these conductive materials. In reactive sputtering of a compound material, the target contains only some of the material components, and the chamber is filled with a gas composed of the remaining material components. The sputtered particles chemically react with the gas and together they deposit on the compound as the compound. The most widely used reactively sputtered compound material is TiN, which is formed from a titanium sputtering target and nitrogen gas.

Most commercial sputter reactors rely on magnetron sputtering to increase the sputtering rate. In a magnetron sputter reactor, a magnet is positioned closely adjacent to the back of the target so that its magnetic field extends into the plasma region adjacent to the front of the target. The magnetic field traps a substantial density of plasma electrons in this area, and to preserve charge neutrality inside the quasi-neutral plasma body the concentration of argon ions also increases. As a result, the target sputtering rate is significantly increased.

Most magnetron magnets are formed as an array of small permanent horseshoe magnets producing a magnetic field in the plasma generally parallel to the target face. One method of producing fairly uniform sputtering for a circular target is to arrange the horseshoe magnets in the outline of a kidney shape and then to rotate the array as a whole about the center of the target. That is, the magnetron is circularly scanned around the target.

Sputter equipment is being currently commercialized for coating flat panel displays, for laptop computer screens and the like. Demaray et al. describes such a sputter chamber in U.S. Pat. No. 5,487,822. This PVD reactor is available from Applied Komatsu Technology, Inc. (AKT) of Santa Clara, Calif. The substrates are large rectangular pieces of glass having edges of up to 600 mm length, and larger sizes are envisioned for the future. The rectangular shape of the substrates has prompted the use of a linear array of permanent magnets for the magnetron with the array being linearly and reciprocally scanned in the direction perpendicular to the array axis. Halsey et al. describe such a linearly scanned magnetron in U.S. patent application Ser. No. 08/684,446, filed Jul. 19, 1996. Some have suggested using the same type of linear magnetron scanning in the circular geometry of sputter equipment intended for fabricating larger silicon wafers, for example, the 300 mm-wafer equipment now being developed.

The continuing development of increasingly complex integrated circuits, whether for memory or logic circuits, is based in large part on decreased minimum feature size, which is being pushed from a challenging 0.35 $\mu$m for commercially available parts to 0.18 $\mu$m and below for future generations now under development. The decreased feature size coupled with the increased number of features on a chip has exposed a problem with particles. Even inside a vacuum reactor, there tend to be significant number of particles, and the particle density increases with decreasing particle dimensions. A single small particle falling on an equally small feature can potentially cause the entire integrated circuit chip to fail. An immediate failure reduces manufacturing yield, sometimes to the vanishing point for a many-step fabrication process. A partial failure caused by a particle degrades performance. A particle embedded in a layer may not immediately cause failure, but may introduce a failure mode, e.g. localized heating as electrical current is forced around the insulating particle. that eventually produces a failure. That is, particles may cause long-term reliability problems. For these reasons, great efforts have been expended in all the technologies involved in fabricating integrated circuits to reduce the number of particles. The particle requirements, often in the range of less than one particle per wafer, are becoming very difficult to meet.

These problems extend to sputtering reactors even though they tend to operate at extremely low vacuums of $10^{-8}$Torr and below.

Historically, particulate contamination has been controlled by strenuous cleaning methods and procedures for enforced cleanliness, e.g. clean rooms. clean room suits, and wafer cassettes. However, some estimate that greater than 80% of particles are generated by the processing equipment itself. As a result, further decreases in particle counts cannot rely only on conventional procedures.

Accordingly, it is greatly desired to develop new methods of reducing particles.

Bennett et al. in U.S. Pat. No. 5,367,139 has taught that many particles are formed from nucleation of the processing gas in plasma processing chambers and that these particles tend to become suspended at the plasma sheath. They believe the particles become negatively charged in their halide etching chemistry. They then suggest a number of methods of sweeping the particles away from the active processing area and trapping them away from the processing area, including modulating the RF power establishing the plasma. Praburam et al. describe the growth and suspension of particles within the plasma in "Observations of particle layers levitated in a radiofrequency sputtering plasma," *Journal of Vacuum Science and Technology A*, vol. 12, 1994 pp. 3137–3145. The positively charged plasma tends to trap negatively charged particles, particularly near the target where the electrostatic and gravitational forces balance. Praburam et al. describe how, once the plasma is extinguished, the particles fall to a surface in the chamber, particularly the wafer. Blanchard et al. in U.S. Pat. No. 5,221,425 also teach that particles can be suspended in the plasma of a magnetically enhanced reactive ion etcher. They suggest at the completion of etching while the wafer remains in the chamber to reduce the magnetic field and/or the RF plasma source bias so that the gas flow sweeps the suspended particles out of the chamber.

Sputtering relies upon the generation of a plasma within the sputtering chamber. A plasma is generated when the voltage applied across the processing gas exceeds the dielectric breakdown limit of the gas although sometimes a plasma igniter, such as a small arc or spark, is used to precipitate the breakdown. In any case, the ignition process is spatially non-uniform, similar to a lightening strike, and may dissipate large amounts of energy in localized areas of surfaces around the sputtering chamber. The energy may be sufficiently high to pit the surface, either vaporizing a small amount of material or dislodging solid material. In either case, particles are created. Once the plasma has been established, an equilibrium condition is established that is less prone to particle generation than is the ignition condition. As a result, the plasma ignition may be a major generator of particles. Some are entrained in the resultant plasma while others are immediately deposited on surrounding areas, including the wafer.

SUMMARY OF THE INVENTION

The invention can be summarized as a particle trap for use in conjunction with a magnetron sputter reactor. It is believed that particles are trapped in a high-density plasma region formed in the magnetic field adjacent to the magnetron. According to the invention, the sweep of the magnetron over the back of the sputtering target is lengthened to at least occasionally place the magnetron and its entrained particles over a trap area removed from the processing area adjacent to the substrate. Preferably, a wall or other means partially isolate the trap area from the processing area. Once the magnetron is over the trap area, one or more of a number of means is used to remove the particles from the area of the magnetron. The power applied to the plasma may be reduced or reversed in polarity. Walls of the trap area may be positively charged. Gas may be flowed at a high rate through the area adjacent to the magnetron.

In another aspect of the invention, the plasma is ignited while the magnetron is over the trap area so that particles generated by the ignition are isolated from the processing area.

DETAILED DESCRIPTION OF THE PREFERRED EMBODIMENTS

Magnetron sputtering provides an additional control over the particles suspended at the plasma sheath. The high-density plasma occupying the area adjacent to the magnetron magnets contains a high fraction of the particles suspended in the plasma, because the plasma potential is most positive adjacent to the target sheath, and the trapping high-density plasma area moves according to the scan pattern of the magnets.

Figure 1:
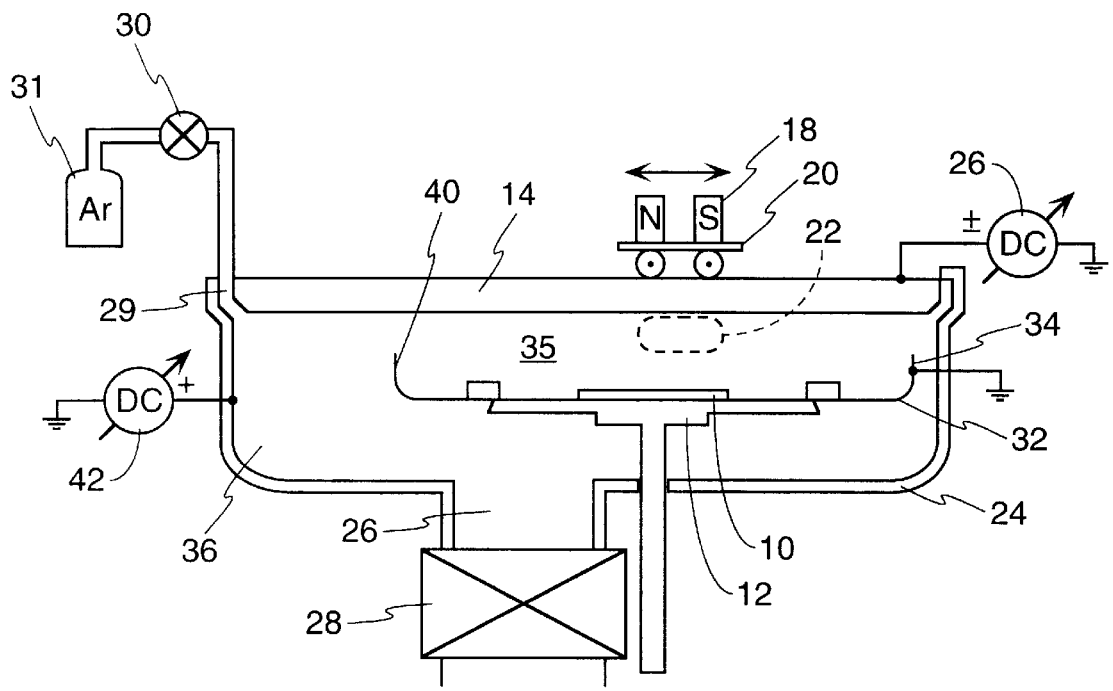
FIG. 1 is a schematic cross-sectional view of an embodiment of a PVD reactor of the invention including a particle trap.

One embodiment of the invention, as illustrated schematically in FIG. 1, is based on a linear magnetron scan, as is performed in the PVD reactor available from AKT. In large part, the PVD chamber is conventional, particularly that part illustrated on the right side of FIG. 1. A substrate 10 is supported on a pedestal 12 which is DC grounded but may be RF biased for control of the plasma. A target 14 in opposition to the pedestal 12 is DC biased by a selectable DC power supply 26, although again the target 14 may additionally be RF biased for closer control of the energy of the sputtering argon ions. For sputtering, the DC power supply 26 biases the target negative with respect to ground so as to both discharge the argon into a plasma and to attract the positively charged argon ions to the target 14. The pedestal 12 is usually floating and assumes a negative potential of −10 to −50VDC with respect to ground.

A linear scanning magnetron 16 is positioned on the back of the target 14 and includes one or more linear arrays of permanent magnets 18 extending out of the plane of the illustration. A schematically illustrated linear scanning mechanism 20 scans the magnets horizontally in the illustration so that the sputtering pattern on the target 14 averages over time to a uniform pattern. However, in the short term, an intense high-density plasma region 22 is formed beneath the magnetron 16 and moves with the magnetron.

The processing is performed within a vacuum chamber 24 which is pumped through a vacuum port 27 by a vacuum pump system 28. For metallic sputtering, a chemically inactive gas such as argon is admitted into the chamber 24 through one or more gas ports 29 arranged at the periphery of the target 14. An adjustable metering valve 30, such as a mass flow controller, supplies a selected flow of argon from an argon gas source 31 to the gas port 29. A removable chamber shield 32 is arranged to protect the walls of the chamber 24 from being sputter coated, and a cylindrical wall 34 of the shield extends upwardly towards the target 14. A processing area 35 is formed above the pedestal 12 inside of the shield 32.

According to the invention, the vacuum chamber 24 is extended to one side to include a trap area 36 formed between the vacuum chamber 24 and a portion 38 of the cylindrical shield wall 34 having a lip 40. The pump port 27 is positioned so that a lower pumping impedance exists from the vacuum pump system 28 to the trap area 36 than to the processing area 35. Preferably, as illustrated, the pump port 27 is positioned at the bottom of the trap area 36 so that any particles that gravitationally fall in the trap area 36 are pumped out of the chamber 24.

The target 14, or at least its backing plate which is often understood to be part of the target. is also extended to overly the trap area 36, and the scanning mechanism 20 of the magnetron 16 is adapted to scan the magnetron 16 over the trap area 36 as well as over the pedestal. The height of the shield lip 40 is designed to be sufficiently separated from the target 14 so that the magnetron 16 can sweep the high-density plasma region 22 over the lip 40 without the shield 32 grounding or otherwise destroying the high-density plasma region 22. A second adjustable DC power supply 42 is connected to the chamber wall 24 or at least to a conductive liner within the chamber wall 24 in the vicinity of the trap area 36.

Figure 2:
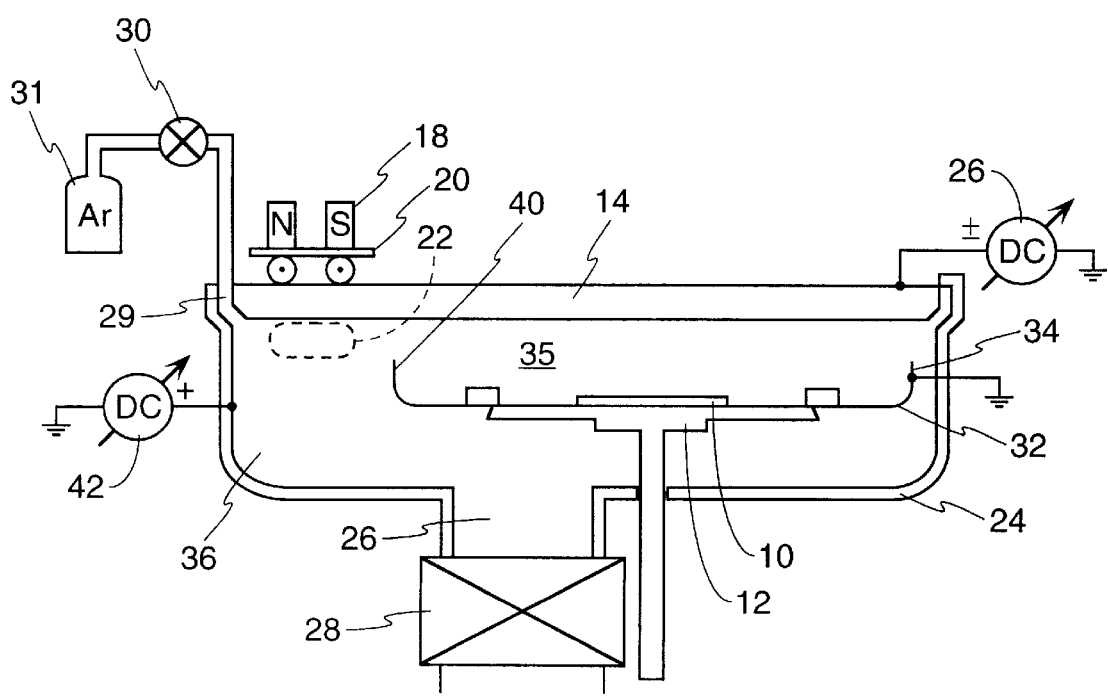
FIG. 2 is a schematic cross-sectional view of the same PVD reactor of FIG. 1 but with the magnetron disposed over the trap area.

In operation, at least an occasional linear scan of the magnetron 16 is extended to carry the magnetron 16 and the accompanying high-density plasma region 22 over the trap area 36, as illustrated in the schematic cross-sectional view of FIG. 2. This extended scan can be performed with the substrate 10 still located within the vacuum chamber 24. The extended scan sweeps the particles entailed in the high-density plasma region 22 out from the processing area 35 overlying the pedestal 12 and substrate 10. Once the entailed particles are within the trap area 36, one or more of several techniques can be used to remove them from the area of the magnetron 16 and to thereby keep them away from the processing area 35.

The particles entrained in the high-density plasma region 22 are typically negatively charged by the plasma electrons, any positively charged particles tending to be expelled from the plasma. Accordingly, one way to detach the particles is to cause the second DC power supply 42 to apply a positive bias to the chamber wall 24 in the trap area 36 while the magnetron 16 is disposed over the trap area 36 to thereby attract the negatively charged particles away from the magnetron. The particles either adhere to the chamber wall or are pumped out of the system through the vacuum pump 28, particularly after the positive bias is removed from the chamber wall.

A second way of detaching the particles is to cause the first DC power supply 26 to reduce the voltage applied to the target 14 while the magnetron 16 is disposed over the trap area 36 so that the plasma discharge ceases. That is, the high-density plasma region 22 collapses and no longer entrains the particles within it. Preferably, the voltage is only slowly reduced so as to reduce electrostatic attraction of the charged particles to the target 14 and to gently move the particles away from the target 14. The particles fall or generally diffuse away in the trap area 36 and the high lip 40 of the shield 32 prevents most of the particles from diffusing to the wafer 10. Instead, the vacuum pump 28 removes them from the reactor. One way of reducing the target voltage is to reverse its polarity from negative to positive. Depending upon the speed of switching polarity the particles will either fall as if the plasma collapsed or will be trapped at the grounded wall.

A third way of detaching the particles relies upon one of the gas ports 29 being positioned over the trap area 36, as illustrated, and directed generally through the high-density plasma region 22 towards the vacuum pump port 27. When the magnetron 16 is positioned over the trap area 36 adjacent to the gas port 29, the metering valve 30 is quickly opened to provide a short, strong pulse of argon. The argon pulse is strong enough to push the particles within the high-density plasma region 22 away from the target. The higher pressure of the pulse also temporarily distorts or even destroys the plasma. When the high-density plasma region 22 is restored to its normal shape, the former particles have been swept away. However, it must be remembered that striking a plasma is a breakdown procedure that is prone to create new particles.

The trapping of charged particles on the exterior side of the shield 32, that is, towards the trap area 36, can be enhanced by forming electrostatic grooves on that exterior side to increase the local electric field.

Other methods of extinguishing the plasma and of removing the charged particles are possible. For example, if the magnets 18 in the magnetron 16 are electromagnets, the electromagnets can be turned down or off while the magnetron 16 is over the trap area 36. Alternatively, the scanning mechanism 20 may cause the magnetron 16 to become further spaced from the target 14 over the trap area 36.

Various ones of these different ways may be combined. For example, after the first DC power supply 26 extinguishes the plasma over the trap area 36, the second DC power supply 42 may bias the chamber wall 24 or the metering valve 30 may pulse argon so as to pull the particles away from the target 14.

The discussion above concentrated on removing particles already existing in a plasma. However, as mentioned above, the ignition of the plasma creates a significant number of particles, both at the target and at the grounding plane. Hence, it is highly desirable to ignite the plasma in the trap area. Although some of those particles will be trapped in the plasma, those generated away from the high-density plasma region will tend to settle on surfaces in the trap area or to be exhausted directly from the trap area and not affect the wafer. Thus, the magnetron should be positioned over the trap area for both the ignition and the extinguishment of the plasma so that particles are trapped there and do not fall on the wafer or other parts of the chamber adjacent to the wafer.

Thus, the invention provides a new approach to reducing particles in a magnetron sputtering chamber by a relatively small modification to the chamber.

What is claimed is:

1. A method of reducing particles in a PVD reactor, comprising the steps of:
    admitting a processing gas into a vacuum chamber having a substrate supported on support;
    applying a first electrical power level to a target comprising a target material positioned over a processing space between said target and said substrate to form a plasma of said processing gas, to thereby sputter said target material from said target to said substrate;
    while said plasma is formed, scanning a magnet assembly over the back of said target from said processing area to an adjacent trap area that is at least partially isolated from said processing area; and
    separating particles suspended in a portion of said plasma associated with said magnet assembly while said magnet assembly is positioned adjacent to said trap area.

2. The method of claim 1, wherein said separating step includes extinguishing said plasma while said magnet assembly is positioned adjacent to said trap area.

3. The method of claim 1, wherein said scanning step reciprocally and linearly moves said magnet assembly.

4. The method of claim 1, wherein said separating step includes reducing said electrical power level applied to said target while said magnet assembly is positioned adjacent to said trap area.

5. The method of claim 1, wherein said separating step includes applying a positive bias to a wall portion of said trap area while said magnet assembly is positioned adjacent to said trap area.

6. The method of claim 1, wherein said separating step includes increasing a flow of a gas adjacent to said target while said magnet assembly is positioned adjacent to said trap area.

7. The method of claim 6, wherein said flow of said gas is directed into an exhaust under said trap area.

8. The method of claim 1 wherein said separating step includes at least two of the following sub-steps:
    (a) extinguishing said plasma while said magnet assembly is positioned adjacent to said trap area:
    (b) reducing said electrical power level applied to said target while said magnet assembly is positioned adjacent to said trap area;

(c) applying a positive bias to a wall portion of said trap area while said magnet assembly is positioned adjacent to said trap area; and (d) increasing a flow of a gas adjacent to said target while said magnet assembly is positioned adjacent to said trap area.

9. The method of claim 1, wherein said applying step ignites said plasma while said scanning step positions said magnet assembly adjacent to said trap area.

10. A method of igniting a plasma in a PVD reactor comprising a vacuum chamber having a processing area containing a substrate support, a target of a material to be sputter deposited on a substrate supported on said substrate support, a trap area at least partially isolated from said processing area by a wall extending toward the target with a free space between a top of the wall and the target, and a magnet assembly scannable over said target adjacent to said processing area and over said trap area, said method comprising the steps of:

positioning said magnet assembly adjacent to said trap area;

exhausting said trap area from a side of the wall opposite the processing area;

while said magnet assembly is so positioned adjacent to said trap area, igniting a plasma in said vacuum chamber; and while maintaining said plasma after ignition, moving said magnet assembly adjacent to said processing area to thereby sputter said material of said target onto said substrate.

11. The method of claim 10, further comprising exhausting said trap area from a side thereof opposite said magnet assembly.

12. The method of claim 10, further comprising:

after sputtering at least some of said material onto said substrate, positioning said magnet assembly adjacent to said trap area while maintaining said plasma; and while said magnet assembly is positioned adjacent to said trap area, separating particles suspended in a portion of said plasma associated with said magnet assembly while said magnet assembly is positioned adjacent to said trapping area.

13. The method of claim 12, wherein said separating step includes extinguishing said plasma.

14. The method of claim 12, wherein said separating step includes increasing a gas flow through an area adjacent to said magnet assembly towards a vacuum exhaust port.

15. The method of claim 10, wherein said plasma contains particles which are capable of causing failure of an integrated circuit formed in said substrate.

16. A PVD reactor with a particle trap, comprising:

a vacuum chamber;

a support within said chamber for supporting a substrate to be processed;

a target disposed over said support, a processing area being formed between said support and said target;

a shield having shield walls extending upwardly from said support inside of lateral chamber walls of said vacuum chamber and arranged to protect said chamber walls from deposition, a trap area being formed on one side of said support between a first one of said shield walls and a first one of said chamber walls;

a source of a processing gas for said vacuum chamber;

a power supply connected to said target to cause said processing gas to form a plasma to sputter said target and thereby sputter deposit a material of said target on said substrate;

a magnetron assembly including magnets scannable over the back of said target over said processing area and over said trap area.

17. The PVD reactor of claim 16, wherein said magnetron assembly is reciprocally and linearly scannable.

* * * * *